(12) United States Patent
Dai et al.

(10) Patent No.: US 11,516,419 B2
(45) Date of Patent: Nov. 29, 2022

(54) DIGITAL TIME STAMPING DESIGN FOR EVENT DRIVEN PIXEL

(71) Applicant: OMNIVISION TECHNOLOGIES, INC., Santa Clara, CA (US)

(72) Inventors: Tiejun Dai, Santa Clara, CA (US); Shoushun Chen, Shanghai (CN); Zhe Gao, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 20 days.

(21) Appl. No.: 17/156,290

(22) Filed: Jan. 22, 2021

(65) Prior Publication Data

US 2022/0239858 A1 Jul. 28, 2022

(51) Int. Cl.
*H04N 5/3745* (2011.01)
*H01L 27/146* (2006.01)
(Continued)

(52) U.S. Cl.
CPC ..... *H04N 5/3745* (2013.01); *H01L 27/14609* (2013.01); *H01L 27/14643* (2013.01);
(Continued)

(58) Field of Classification Search
CPC .. H04N 5/3745; H04N 5/3454; H04N 5/3456; H04N 5/3559; H04N 5/378; H01L 27/14609; H01L 27/14643
See application file for complete search history.

(56) References Cited

U.S. PATENT DOCUMENTS

| 8,780,240 | B2 | 7/2014 | Posch et al. |
| 9,961,291 | B2 | 5/2018 | Chen |

(Continued)

FOREIGN PATENT DOCUMENTS

| CN | 109842768 | * 6/2019 |
| WO | WO 2019/205217 A1 | 10/2019 |

(Continued)

OTHER PUBLICATIONS

Chen et al., "A Motion Sensor with On-Chip Pixel Rendering Module for Optical Flow Gradient Extraction", 2018 IEEE International Symposium on Circuits and Systems (ISCAS), 2018 (Year: 2018).*

(Continued)

*Primary Examiner* — Albert H Cutler
(74) *Attorney, Agent, or Firm* — Perkins Coie LLP (57) ABSTRACT

An event driven pixel includes a photodiode configured to photogenerate charge in response to incident light received from an external scene. A photocurrent to voltage converter is coupled to the photodiode to convert photocurrent generated by the photodiode to a voltage. A filter amplifier is coupled to the photocurrent to voltage converter to generate a filtered and amplified signal in response to the voltage received from the photocurrent to voltage converter. A threshold comparison stage is coupled to the filter amplifier to compare the filtered and amplified signal received from the filter amplifier with thresholds to asynchronously detect events in the external scene in response to the incident light. A digital time stamp generator is coupled to asynchronously generate a digital time stamp in response to the events asynchronously detected in the external scene by the threshold comparison stage.

24 Claims, 4 Drawing Sheets

(51) Int. Cl.
- *H04N 5/345* (2011.01)
- *H04N 5/355* (2011.01)
- *H04N 5/378* (2011.01)

(52) U.S. Cl.
CPC ......... *H04N 5/3454* (2013.01); *H04N 5/3456* (2013.01); *H04N 5/3559* (2013.01); *H04N 5/378* (2013.01)

(56) References Cited

U.S. PATENT DOCUMENTS

| | | | |
|---|---|---|---|
| 9,967,479 B2 | 5/2018 | Matolin et al. | |
| 10,181,194 B2 | 1/2019 | Chen | |
| 10,212,380 B2 | 2/2019 | Chen | |
| 10,255,312 B2 | 4/2019 | Swan et al. | |
| 10,469,776 B2 | 11/2019 | Finateu et al. | |
| 10,567,682 B2 | 2/2020 | Matolin et al. | |
| 2010/0182468 A1* | 7/2010 | Posch | H04N 3/155 348/294 |
| 2019/0141265 A1* | 5/2019 | Finateu | H04N 5/3745 |
| 2020/0150773 A1* | 5/2020 | Son | G06F 3/167 |
| 2021/0258525 A1* | 8/2021 | Matolin | H04N 5/378 |
| 2021/0344865 A1* | 11/2021 | Guo | H04N 5/23218 |

FOREIGN PATENT DOCUMENTS

| | | |
|---|---|---|
| WO | WO 2020/002562 A1 | 1/2020 |
| WO | WO 2020/014813 A1 | 1/2020 |

OTHER PUBLICATIONS

Lichtsteiner, P., et al., "A 128×128 120 dB 15 μs latency asynchronous temporal contrast vision sensor," IEEE Journal of Solid State Circuits, 43(2):566-576, 13 pages.

Posch, Christoph et al., "Retinomorphic Event-Based Vision Sensors: Bioinspired CamerasWith Spiking Output," Proceedings of the IEEE | vol. 102, No. 10, Oct. 2014, pp. 1470-1484.

* cited by examiner

DIGITAL TIME STAMPING DESIGN FOR EVENT DRIVEN PIXEL

BACKGROUND INFORMATION

Field of the Disclosure

This disclosure relates generally to image sensors, and in particular but not exclusively, relates to image sensors that include event sensing circuitry.

Background

Image sensors have become ubiquitous and are now widely used in digital cameras, cellular phones, security cameras, as well as medical, automobile, and other applications. As image sensors are integrated into a broader range of electronic devices, it is desirable to enhance their functionality, performance metrics, and the like in as many ways as possible (e.g., resolution, power consumption, dynamic range, etc.) through both device architecture design as well as image acquisition processing.

A typical image sensor operates in response to image light from an external scene being incident upon the image sensor. The image sensor includes an array of pixels having photosensitive elements (e.g., photodiodes) that absorb a portion of the incident image light and generate image charge upon absorption of the image light. The image charge photogenerated by the pixels may be measured as analog output image signals on column bitlines that vary as a function of the incident image light. In other words, the amount of image charge generated is proportional to the intensity of the image light, which is read out as analog image signals from the column bitlines and converted to digital values to provide information that is representative of the external scene.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. In addition, common but well-understood elements that are useful or necessary in a commercially feasible embodiment are often not depicted in order to facilitate a less obstructed view of these various embodiments of the present invention.

DETAILED DESCRIPTION

Various examples directed to an event driven pixel with a digital time stamping design are described herein. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail in order to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Spatially relative terms, such as "beneath," "below," "over," "under," "above," "upper," "top," "bottom," "left," "right," "center," "middle," and the like, may be used herein for ease of description to describe one element or feature's relationship relative to another element(s) or feature(s) as illustrated in the figures. It will be understood that the spatially relative terms are intended to encompass different orientations of the device in use or operation in addition to the orientation depicted in the figures. For example, if the device in the figures is rotated or turned over, elements described as "below" or "beneath" or "under" other elements or features would then be oriented "above" the other elements or features. Thus, the exemplary terms "below" and "under" can encompass both an orientation of above and below. The device may be otherwise oriented (rotated ninety degrees or at other orientations) and the spatially relative descriptors used herein are interpreted accordingly. In addition, it will also be understood that when an element is referred to as being "between" two other elements, it can be the only element between the two other elements, or one or more intervening elements may also be present.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

Although traditional image/video sensors offer great image and/or video capturing capabilities, one of the limitations with traditional image/video sensors is that it is difficult for normal image/video sensors to provide ultra-high frame rates and ultra-high speed capture capabilities that may be useful in a variety of applications such as machine vision, gaming, artificial intelligence sensing, etc. Usually, traditional image/video sensors utilize active pixel sensors, which require certain amounts of exposure times in order to integrate small photocurrents, and then output the image data in image frames in the acquisition order. In order to capture high speed motion, the active pixel sensors have to run at very high frame rates. This results in massive quantities of data output by the traditional active pixel sensors. This output data usually contains a very high level of redundancy from frame to frame, much of which may be used to convey the same static or slow-changing background of the field of view. In other words, large amounts of background information are constantly sampled, re-sampled, output, and then reprocessed with traditional active pixel sensors. Attempts to provide typical image/video sensors to with such ultra-high frame rates and ultra-high speed capabilities have resulted in compromised solutions that provide poor quality image/video captures compared to their normal image/video sensor counterparts.

As will be shown, various examples of an event driven pixel with a digital time stamping design are disclosed. In the various examples, the event driven pixel detects events asynchronously on a pixel level without the need for capturing an entire frame with a very high level of redundancy. This enables the event driven pixel to detect events with ultra-high frame rates and ultra-high speed capabilities. Due to the asynchronous nature of the ultra-high speed capabilities, example event driven pixels in accordance with the teachings of the invention also include a digital time stamp in order to maintain the correct sequence of events for the asynchronously detected events. In other words, each event that is detected includes a digital time stamp so that the asynchronously detected events can be reconstructed and processed in the correct order in which the events occurred in accordance with the teachings of the invention.

Figure 1:
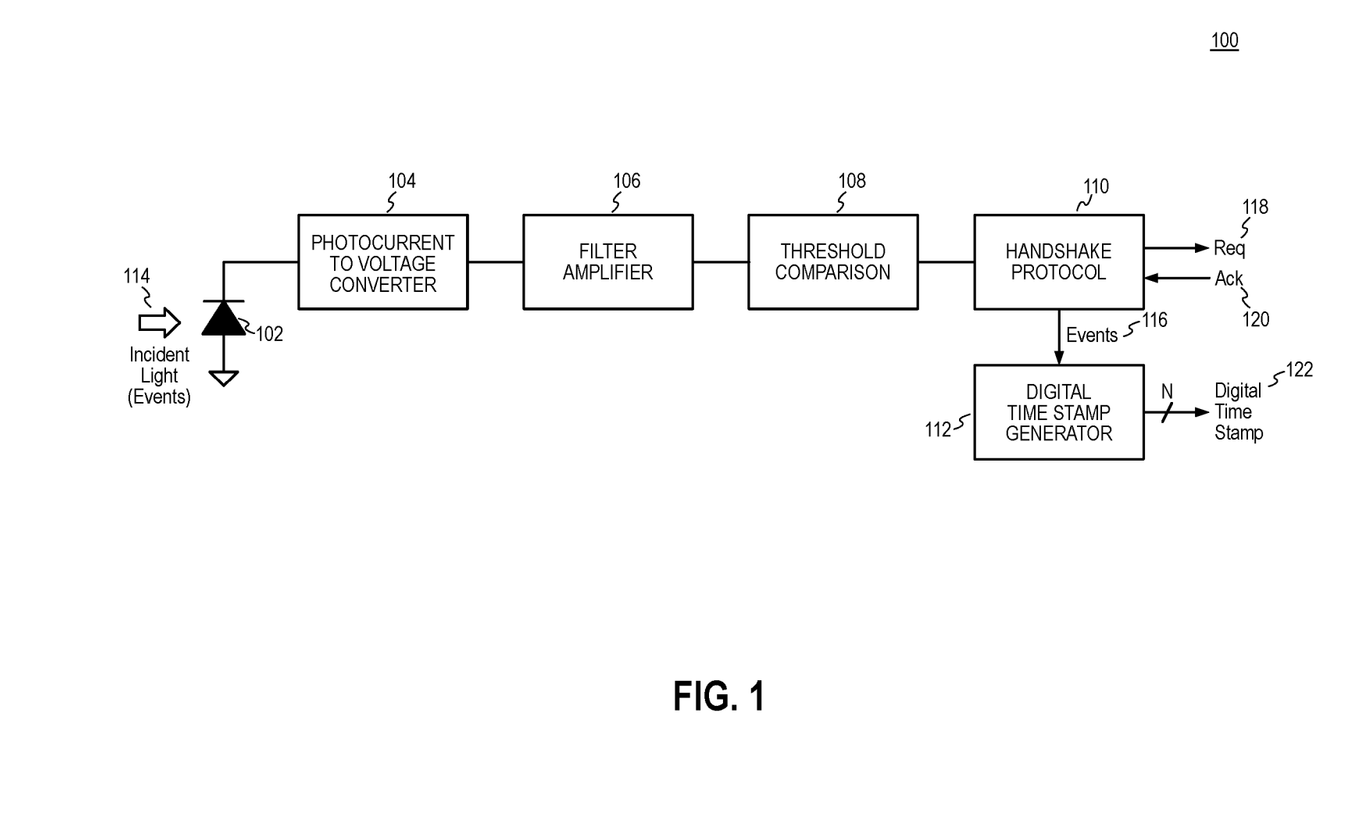
FIG. 1 is a block diagram illustrating one example of an event driven pixel with a digital time stamping design in accordance with the teachings of the present invention.

To illustrate, FIG. 1 illustrates one example of an event driven pixel 100 with a digital time stamping design in accordance with the teachings of the present invention. As shown in the depicted example, event driven pixel 100 includes a photodiode 102 configured to photogenerate charge or photocurrent in response to incident light 114 received from an external scene. A photocurrent to voltage converter 104 is coupled to the photodiode 102 to convert photocurrent generated by the photodiode 102 to a voltage. A filter amplifier 106 is coupled to the photocurrent to voltage converter 104 to generate a filtered and amplified signal in response to the voltage received from the photocurrent to voltage converter 104. A threshold comparison stage 108 is coupled to the filter amplifier 106 to compare the filtered and amplified signal received from the filter amplifier 106 with thresholds to asynchronously detect events that occur in the external scene in response to the incident light 114. As shown in the depicted example, a handshake protocol stage 110 is coupled to the threshold comparison stage 108 to generate and receive handshake signals in response to the events asynchronously detected in incident light 114 from the external scene by the threshold comparison stage 108. In various examples, the handshake signals generated and received by the handshake protocol stage include request signals 118 and acknowledge signals 120. In various examples, the handshake signals may also include a reset signal, which will be described in greater detail below, that can be utilized to reset the filter amplifier 106.

The example depicted in FIG. 1 also illustrates that event driven pixel 100 includes a digital time stamp generator 112 that is coupled to asynchronously generate a digital time stamp 122 in response to the events that are asynchronously detected in incident light 114 from the external scene by the threshold comparison stage 108. In one example, the digital time stamp generator 112 is coupled to receive an events signal 116 that is forwarded to the digital time stamp generator 112 from the threshold comparison stage 108 through the handshake protocol stage 110. In one example, the digital time stamp 122 is an N bit digital signal. With the digital time stamp generator 112, each event that is detected by the event driven pixel 100 has an associated digital time stamp 122 in accordance with the teachings of the present invention.

In operation, when an event occurs in an external scene, that event is indicated in the incident light 114 that is received by photodiode 102 as a quick or sudden change in intensity or brightness. In other words, if the external scene is static, and thus there is no event occurring, the brightness of incident light 114 remains substantially unchanged. As such, the photocurrent generated by photodiode 102 remains substantially constant. However, if an event occurs (e.g., movement, etc.) in the external scene, the event is indicated with an asynchronous quick or sudden change in the brightness of incident light 114. The change in brightness can be from darker to brighter or from brighter to darker. As such, there is an asynchronous change or delta in the photocurrent generated by photodiode 102. The change or delta in the photocurrent is converted to a voltage by photocurrent to voltage converter 104, filtered and amplified by filter amplifier 106, and then detected with the threshold comparison stage 108 in accordance with the teachings of the present invention.

It is noted that event driven pixel 100 does not need to record an entire regular image, and therefore is not burdened with having to capture all of the highly redundant information of a normal image from frame to frame. Instead, in various example, the event driven pixel 100 only records the location of where an event is detected (e.g., the x-y coordinates of photodiode 102 in a pixel array where the event was detected), the polarity of change in the photocurrent for that event (e.g., brighter or darker), and when that event occurred.

In other words, event driven pixel 100 only needs to detect movement or motion, not entire frames of images/video, thereby requiring only a low data rate enabling ultra-high frame rates and ultra-high speed capabilities. In the various examples, the event data may be read out asynchronously, and as such, may possibly be read out in an out of order sequence. As such, the digital time stamp 122 associated with each event occurrence in events signal 116 helps to ensure that detected events are processed and are reconstructed back into the correct order in which the events occurred in accordance with the teachings of the present invention. In various examples, the event data from the event driven pixel 100 may be combined with a normal image or video capture to reconstruct a high frame rate, high quality image or video with event detection via software, an artificial intelligence (AI) network, etc., in accordance with the teachings of the present invention.

Figure 2A:
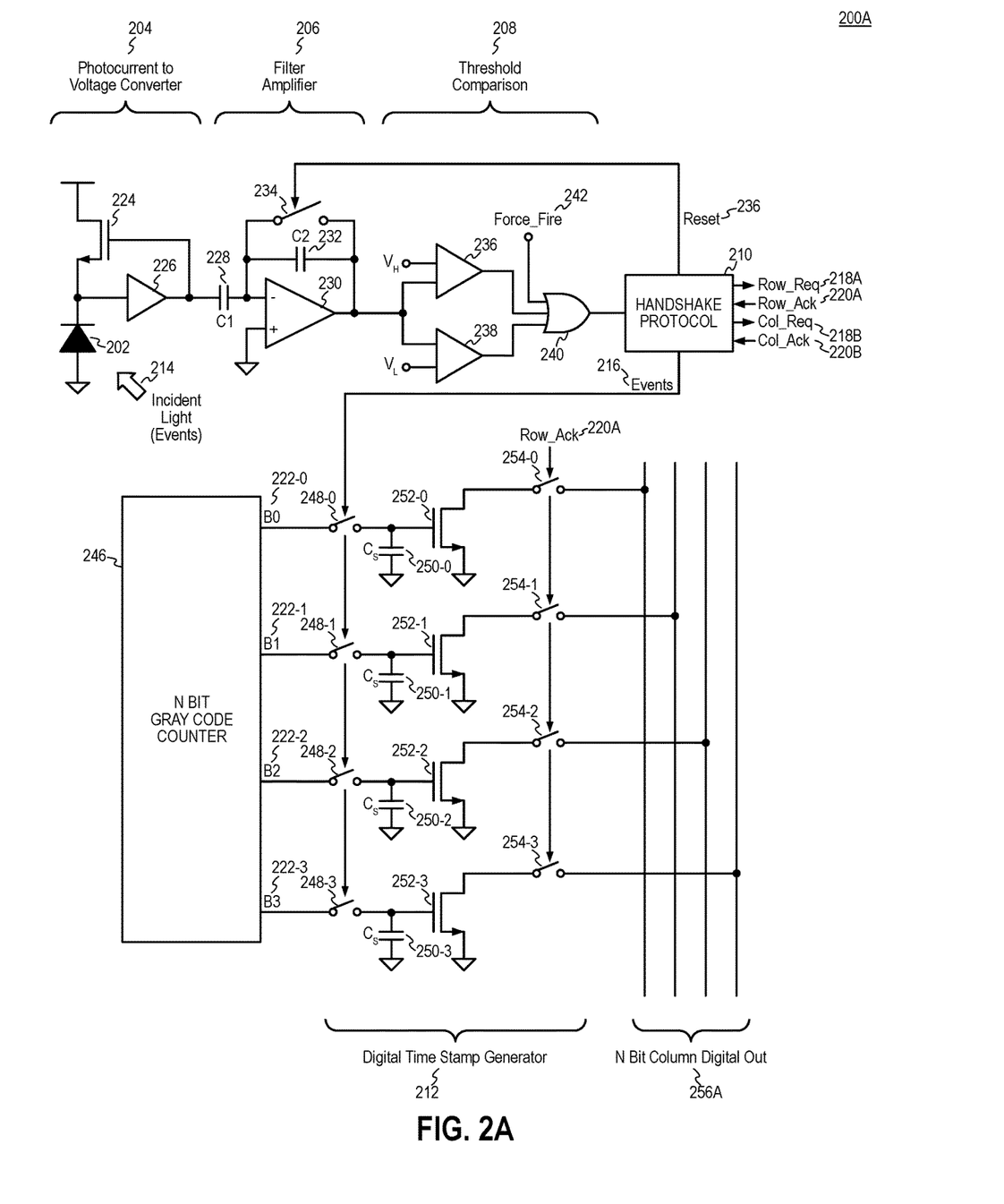
FIG. 2A illustrates a schematic of one example of an event driven pixel with a digital time stamping design in accordance with the teachings of the present invention.

FIG. 2A illustrates a schematic of one example of an event driven pixel 200A with a digital time stamping design in accordance with the teachings of the present invention. It is appreciated that the event driven pixel 200A of FIG. 2A may be an example implementation of event driven pixel 100 as shown in FIG. 1, and that similarly named and numbered elements described above are coupled and function similarly below.

As shown in the example depicted in FIG. 2A, event driven pixel 200A includes a photodiode 202 configured to photogenerate charge or photocurrent in response to incident light 214 received from an external scene. A photocurrent to voltage converter 204 is coupled to the photodiode 202 to convert photocurrent generated by the photodiode 202 to a voltage.

In one example, photocurrent to voltage converter 204 is configured to generate an output voltage that has a logarithmic relation with the intensity of the incident light 214 received from the external scene. In the depicted example, voltage converter 204 includes an amplifier 226 having an input coupled to the photodiode 202 and a transistor 224 having a source coupled to the photodiode 202 and to the input of the amplifier 226. As shown, transistor 224 also has a gate coupled to an output of the amplifier 226, and a drain coupled to a supply voltage. In other examples, it is appreciated that photocurrent to voltage converter 204 may have other schematic configurations that provide an output voltage that is responsive to the intensity of the incident light 214 received from the external scene in accordance with the teachings of the present invention.

Continuing with the depicted example, a filter amplifier 206 is coupled to the photocurrent to voltage converter 204 to generate a filtered and amplified signal in response to the voltage received from the photocurrent to voltage converter 204. In the depicted example, the filter amplifier 206 includes a high pass filter that is configured to filter out lower frequency components from the voltage received from the photocurrent to voltage converter 204. In so doing, the event driven pixel 200A is configured to ignore slow or gradual changes in the photocurrent and instead detect quick or sudden changes that occur in the photocurrent generated by the photodiode 202.

In the depicted example, the filter amplifier 206 includes an opamp 230 having a first input (e.g., non-inverting input), a second input (e.g., inverting input), and an output. In the example, the first input of the opamp 230 is coupled to ground. A first capacitor C1 228 is coupled between an output of the photocurrent to voltage converter 204 and the second input of the opamp 230. A second capacitor C2 232 is coupled between the second input of the opamp 230 and the output of the opamp 230. A reset switch 234 is also coupled between the second input of the opamp 230 and the output of the opamp 230. As will be discussed in greater detail below, the reset switch 234 is configured to be switched in response to a reset signal coupled to be received from the handshake protocol stage 210 in response to the events asynchronously detected in incident light 214 from the external scene by a threshold comparison stage 208. In other examples, it is appreciated that filter amplifier 206 may have other schematic configurations that filter and amplify the output voltage of the photocurrent to voltage converter 204 in accordance with the teachings of the present invention.

The example depicted in FIG. 2A shows that the threshold comparison stage 208 is coupled to the filter amplifier 206 to compare the filtered and amplified signal received from the filter amplifier 206 with thresholds (e.g., $V_H$ and $V_L$) to asynchronously detect events that occur in the external scene in response to the incident light 214. In the depicted example, threshold comparison stage 208 includes a first comparator 236 having a first input coupled to receive a high threshold value (e.g., $V_H$) and a second input coupled to receive the filtered and amplified signal from the filter amplifier 206. Threshold comparison stage 208 also includes a second comparator 238 having a first input coupled to receive a low threshold value (e.g., $V_L$) and a second input coupled to receive the filtered and amplified signal from the filter amplifier 206. In one example, the first comparator 236 may be triggered when the brightness or intensity of the incident light 214 changes in one direction (e.g., darker to brighter) and the second comparator 238 may be triggered when the brightness or intensity of the incident light 214 changes in the other direction (e.g., brighter to darker), or vice-versa.

In one example, threshold comparison stage 208 also includes an OR gate 240 having inputs that are coupled to receive the outputs of the first comparator 236 and the second comparator 238. In operation, the output of the OR gate 240 is triggered when the output of the first comparator 236 and/or the output of the second comparator 238 is triggered. Therefore, in one example, the output of OR gate 240 may be considered to be the events signal. In one example, the OR gate 240 may also be coupled to receive a Force_Fire signal 242 to force the output of OR gate 240 to be triggered.

As shown in the depicted example, a handshake protocol stage 210 is coupled to the output of the threshold comparison stage 208 to generate and receive handshake signals in response to the events asynchronously detected in incident light 214 from the external scene by the threshold comparison stage 208. In various examples, the handshake signals generated and received by the handshake protocol stage 210 include row request signal Row_Req 218A, column request signal Col_Req 218B, row acknowledge signal Row_Ack 220A, and column acknowledge signal Col_Ack 220B. In the depicted example, the handshake signals generated by handshake protocol stage 210 also include reset signal 236, which is configured to reset the reset switch 234 of filter amplifier 206 as shown in response to the events asynchronously detected in incident light 214 from the external scene by the threshold comparison stage 208. In the example depicted in FIG. 2A, the handshake protocol stage 210 is also configured to generate or forward the events signal 216 to the digital time stamp generator 212 in response to the events asynchronously detected in incident light 214 from the external scene by the threshold comparison stage 208.

For instance, as shown in the example depicted in FIG. 2A, digital time stamp generator 212 includes a plurality of N event switches including event switches 248-0, 248-1, 248-2, and 248-3 in FIG. 2A that are coupled to receive an N bit digital time stamp 222 from a digital counter 246. In various examples, digital counter 246 is outside the pixel array and may be shared among a plurality of event driven pixels. In one example, digital counter 246 is coupled to asynchronously generate the N bit digital time stamp 222, which is configured to be stored in digital memory of the digital time stamp generator 212 in response to the events that are asynchronously detected in incident light 214 from the external scene by the threshold comparison stage 208. As shown in the example depicted in FIG. 2A, the digital time stamp 222 is an N=4 bit digital signal that includes a first bit B0 222-0, a second bit B1 222-1, a third bit B2 222-2, and a fourth bit B3 222-3. In other examples it is appreciated that the digital time stamp 222 may include a different number of digital bits. For instance, in one example, more bits can be utilized for higher frame rate recovery to reconstruct a higher frame rate video.

In one example, the N bit digital counter 246 is an N bit Gray code counter. It is appreciated that by using a Gray code counter, power consumption is reduced because there is a minimum number of code transitions between consecutive Gray code counts. In particular, Gray code is a representation of binary code where any two successive values in a consecutive order differ in only one digital bit. The minimized number of bit transactions of Gray code counters results in less power consumption compared to binary counters.

Continuing with the depicted example, event switch 248-0 is coupled to receive first bit B0 222-0, event switch 248-1 is coupled to receive second bit B1 222-1, event switch 248-2 is coupled to receive third bit B2 222-2, and event switch 248-3 is coupled to receive fourth bit B0 222-0. In the example, the event switches 248-0, 248-1, 248-2, and 248-3 are coupled to be switched in response to the events signal 216 as shown.

In the illustrated example, an N bit digital memory coupled to the plurality of N=4 event switches 248-0, 248-1, 248-2, and 248-3. In the depicted example, each bit of the digital memory is implemented with a 1T1C (one-transistor, one-capacitor) 3D MIM (three dimensional metal-insulator-metal) memory cell. As such, the example depicted in FIG. 2A illustrates the N bit digital memory including storage capacitor $C_S$ 250-0 and output transistor 252-0 coupled to event switch 248-0, storage capacitor $C_S$ 250-1 and output transistor 252-1 coupled to event switch 248-1, storage capacitor $C_S$ 250-2 and output transistor 252-2 coupled to event switch 248-2, and storage capacitor $C_S$ 250-3 and output transistor 252-3 coupled to event switch 248-3 as shown. Thus, each storage capacitor $C_S$ 250-0, 250-1, 250-2, and 250-3, is coupled to be selectively charged through a respective one of the plurality of N=4 event switches 248-0, 248-1, 248-2, and 248-3, and is coupled to ground. Each output transistor 250-0, 250-1, 250-2, and 250-3 has a gate coupled to a respective storage capacitor $C_S$ 250-0, 250-1, 250-2, and 250-3, a source coupled to ground, and a drain coupled to output the respective bit 222-0, 222-1, 222-2, and 222-3 of the N bit digital count to a column digital out 256A.

In the example depicted in FIG. 2A, the column digital out 256A includes a plurality of N=4 bitlines. As such, the digital time stamp generator 212 further includes a plurality of N=4 memory output switches 254-0, 254-1, 254-2, and 254-3 that are coupled to respective output transistors 252-0, 252-1, 252-2, and 252-3 of the N bit digital memory. In operation, each bitline of the column digital out 256A is coupled to receive a respective bit 222-0, 222-1, 222-2, and 222-3 of the N bit digital count in parallel through a respective one of the plurality of N memory output switches 254-0, 254-1, 254-2, and 254-3 in response to a row acknowledge signal Row_Ack 220A in accordance with the teachings of the present invention.

Figure 2B:
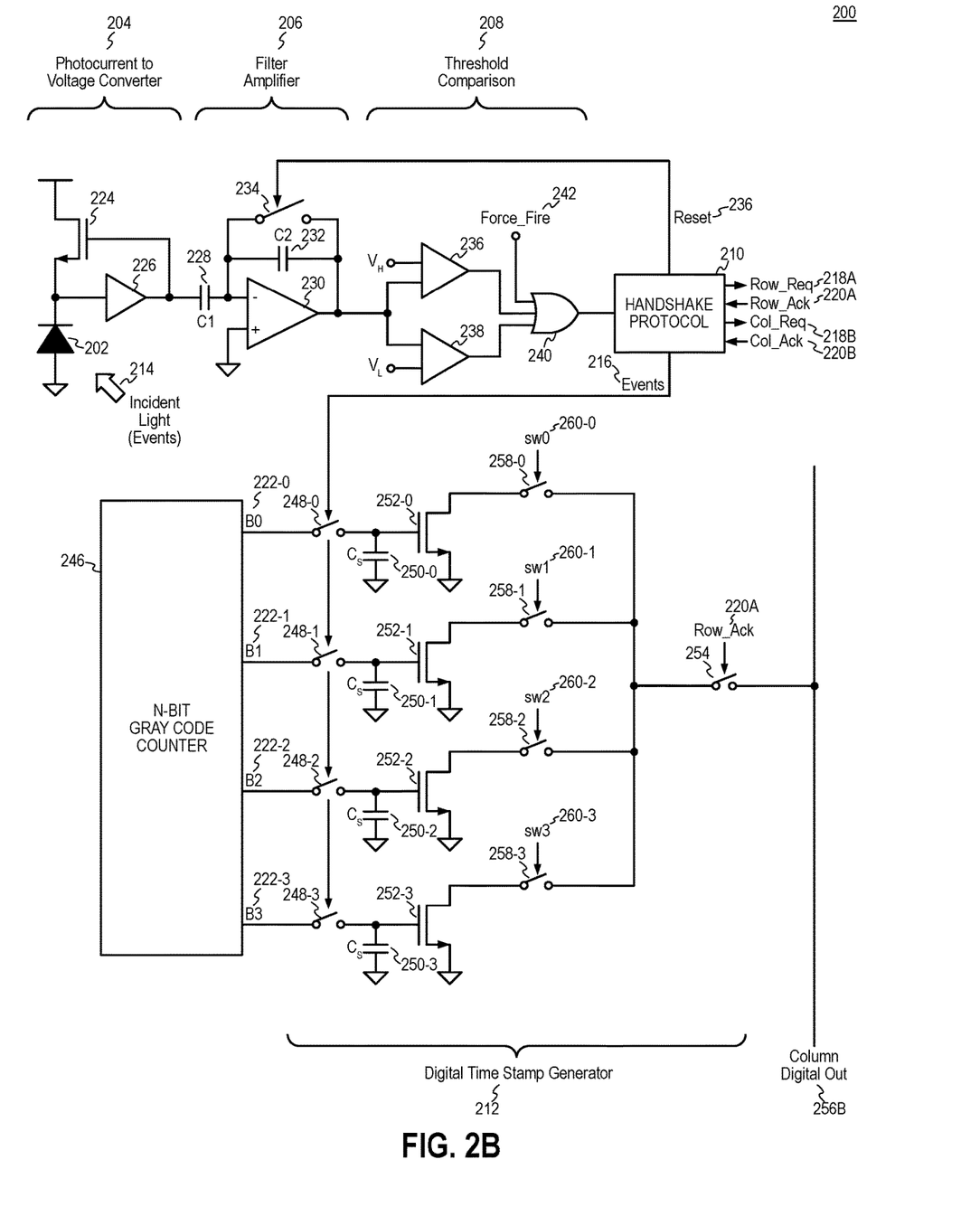
FIG. 2B illustrates a schematic of another example of an event driven pixel with a digital time stamping design in accordance with the teachings of the present invention.

FIG. 2B illustrates a schematic of another example of an event driven pixel 200B with a digital time stamping design in accordance with the teachings of the present invention. It is appreciated that the event driven pixel 200B of FIG. 2B may be another example implementation of event driven pixel 100 as shown in FIG. 1, and that similarly named and numbered elements described above are coupled and function similarly below. It is further appreciated that example event driven pixel 200B of FIG. 2B shares many similarities with example event driven sensor 200A of FIG. 2A.

For instance, as shown in the example depicted in FIG. 2B, event driven pixel 200B includes a photodiode 202 configured to photogenerate charge or photocurrent in response to incident light 214 received from an external scene. A photocurrent to voltage converter 204 is coupled to the photodiode 202 to convert photocurrent generated by the photodiode 202 to a voltage. In one example, photocurrent to voltage converter 204 is configured to generate an output voltage that has a logarithmic relation with the intensity of the incident light 214 received from the external scene. In the depicted example, voltage converter 204 includes an amplifier 226 having an input coupled to the photodiode 202 and a transistor 224 having a source coupled to the photodiode 202 and to the input of the amplifier 226. As shown, transistor 224 also has a gate coupled to an output of the amplifier 226, and a drain coupled to a supply voltage.

Continuing with the depicted example, a filter amplifier 206 is coupled to the photocurrent to voltage converter 204 to generate a filtered and amplified signal in response to the voltage received from the photocurrent to voltage converter 204. In the depicted example, the filter amplifier 206 includes a high pass filter that is configured to filter out lower frequency components from the voltage received from the photocurrent to voltage converter 204. In so doing, the event driven pixel 200B is configured to ignore slow or gradual changes in the photocurrent and instead detect quick or sudden changes that occur in the photocurrent generated by the photodiode 202.

In the depicted example, the filter amplifier 206 includes an opamp 230 having a first input (e.g., non-inverting input), a second input (e.g., inverting input), and an output. In the example, the first input of the opamp 230 is coupled to ground. A first capacitor C1 228 is coupled between an output of the photocurrent to voltage converter 204 and the second input of the opamp 230. A second capacitor C2 232 is coupled between the second input of the opamp 230 and the output of the opamp 230. A reset switch 234 is also coupled between the second input of the opamp 230 and the output of the opamp 230.

The example depicted in FIG. 2B shows that the threshold comparison stage 208 is coupled to the filter amplifier 206 to compare the filtered and amplified signal received from the filter amplifier 206 with thresholds (e.g., $V_H$ and $V_L$) to asynchronously detect events that occur in the external scene in response to the incident light 214. In the depicted example, threshold comparison stage 208 includes a first comparator 236 having a first input coupled to receive a high threshold value (e.g., $V_H$) and a second input coupled to receive the filtered and amplified signal from the filter amplifier 206. Threshold comparison stage 208 also includes a second comparator 238 having a first input coupled to receive a low threshold value (e.g., $V_L$) and a second input coupled to receive the filtered and amplified signal from the filter amplifier 206. In one example, the first comparator 236 may be triggered when the brightness or intensity of the incident light 214 changes in one direction (e.g., darker to brighter) and the second comparator 238 may be triggered when the brightness or intensity of the incident light 214 changes in the other direction (e.g., brighter to darker), or vice-versa.

In one example, threshold comparison stage 208 also includes an OR gate 240 having inputs that are coupled to receive the outputs of the first comparator 236 and the second comparator 238. In operation, the output of the OR gate 240 is triggered when the output of the first comparator 236 and/or the output of the second comparator 238 is triggered. Therefore, in one example, the output of OR gate 240 may be considered to be the events signal. In one example, the OR gate 240 may also be coupled to receive a Force_Fire signal 242 to force the output of OR gate 240 to be triggered.

As shown in the depicted example, a handshake protocol stage 210 is coupled to the output of the threshold comparison stage 208 to generate and receive handshake signals in response to the events asynchronously detected in incident light 214 from the external scene by the threshold comparison stage 208. In various examples, the handshake signals generated and received by the handshake protocol stage 210 include row request signal Row_Req 218A, column request signal Col_Req 218B, row acknowledge signal Row_Ack 220A, and column acknowledge signal Col_Ack 220B. In the depicted example, the handshake signals generated by handshake protocol stage 210 also include reset signal 236, which is configured to reset the reset switch 234 of filter amplifier 206 as shown in response to the events asynchronously detected in incident light 214 from the external scene by the threshold comparison stage 208. In the example depicted in FIG. 2B, the handshake protocol stage 210 is also configured to generate or forward the events signal 216 to the digital time stamp generator 212 in response to the events asynchronously detected in incident light 214 from the external scene by the threshold comparison stage 208.

As shown in the example depicted in FIG. 2B, digital time stamp generator 212 includes a plurality of N event switches including event switches 248-0, 248-1, 248-2, and 248-3 in FIG. 2B that are coupled to receive an N bit digital time stamp 222 from a digital counter 246. In various example, digital counter 246 is outside the pixel array and may be shared among a plurality of event driven pixels. In one example, digital counter 246 is coupled to asynchronously generate the N bit digital time stamp 222, which is configured to be stored in digital memory of the digital time stamp generator 212 in response to the events that are asynchronously detected in incident light 214 from the external scene by the threshold comparison stage 208. As shown in the example depicted in FIG. 2B, the digital time stamp 222 is an N=4 bit digital signal that includes a first bit B0 222-0, a second bit B1 222-1, a third bit B2 222-2, and a fourth bit B3 222-3. In one example, the N bit digital counter 246 is an N bit Gray code counter.

Continuing with the depicted example, event switch 248-0 is coupled to receive first bit B0 222-0, event switch 248-1 is coupled to receive second bit B1 222-1, event switch 248-2 is coupled to receive third bit B2 222-2, and event switch 248-3 is coupled to receive fourth bit B0 222-0. In the example, the event switches 248-0, 248-1, 248-2, and 248-3 are coupled to be switched in response to the events signal 216 as shown.

In the illustrated example, an N bit digital memory coupled to the plurality of N=4 event switches 248-0, 248-1, 248-2, and 248-3. In the depicted example, each bit of the digital memory is implemented with a 1T1C (one-transistor, one-capacitor) 3D MIM (three dimensional metal-insulator-metal) memory cell. As such, the example depicted in FIG. 2B illustrates the N bit digital memory including storage capacitor $C_S$ 250-0 and output transistor 252-0 coupled to event switch 248-0, storage capacitor $C_S$ 250-1 and output transistor 252-1 coupled to event switch 248-1, storage capacitor $C_S$ 250-2 and output transistor 252-2 coupled to event switch 248-2, and storage capacitor $C_S$ 250-3 and output transistor 252-3 coupled to event switch 248-3 as shown. Thus, each storage capacitor $C_S$ 250-0, 250-1, 250-2, and 250-3, is coupled to be selectively charged through a respective one of the plurality of N=4 event switches 248-0, 248-1, 248-2, and 248-3, and is coupled to ground. Each output transistor 250-0, 250-1, 250-2, and 250-3 has a gate coupled to a respective storage capacitor $C_S$ 250-0, 250-1, 250-2, and 250-3, a source coupled to ground, and a drain coupled to output the respective bit 222-0, 222-1, 222-2, and 222-3 of the N bit digital count to a column digital out 256B.

In the example depicted in FIG. 2B, the column digital out 256B includes one bitline as shown. As such, the digital time stamp generator 212 further includes a plurality of N=4 memory output switches 258-0, 258-1, 258-2, and 258-3 coupled to respective output transistors 252-0, 252-1, 252-2, and 252-3 of the N bit digital memory. In operation, each of the plurality of N=4 memory output switches 258-0, 258-1, 258-2, and 258-3 is coupled to be switched in response to a respective memory output signal sw0 260-0, sw1 260-1, sw2 260-2, and sw3 260-3 as shown.

Continuing with the example depicted in FIG. 2B, a row acknowledge switch 254 is coupled between the plurality of N memory output switches 258-0, 258-1, 258-2, and 258-3 and the bitline of the column digital out 256B. In the depicted example, the row acknowledge switch 254 is switched in response to the row acknowledge signal Row_Ack 220A such that the bitline of the column digital out 256B is coupled to receive each respective bit 222-0, 222-1, 222-2, and 222-3 of the N bit digital count in sequence through a respective one of the plurality of N memory output switches 258-0, 258-1, 258-2, and 258-3 and row acknowledge switch 254. It is appreciated that with the shared 1 bit bus provided by the bitline of column digital out 256B of event driven pixel 200B of FIG. 2B, output signal coupling from each of the digital bits is reduced compared to event driven pixel 200A of FIG. 2A.

Figure 2C:
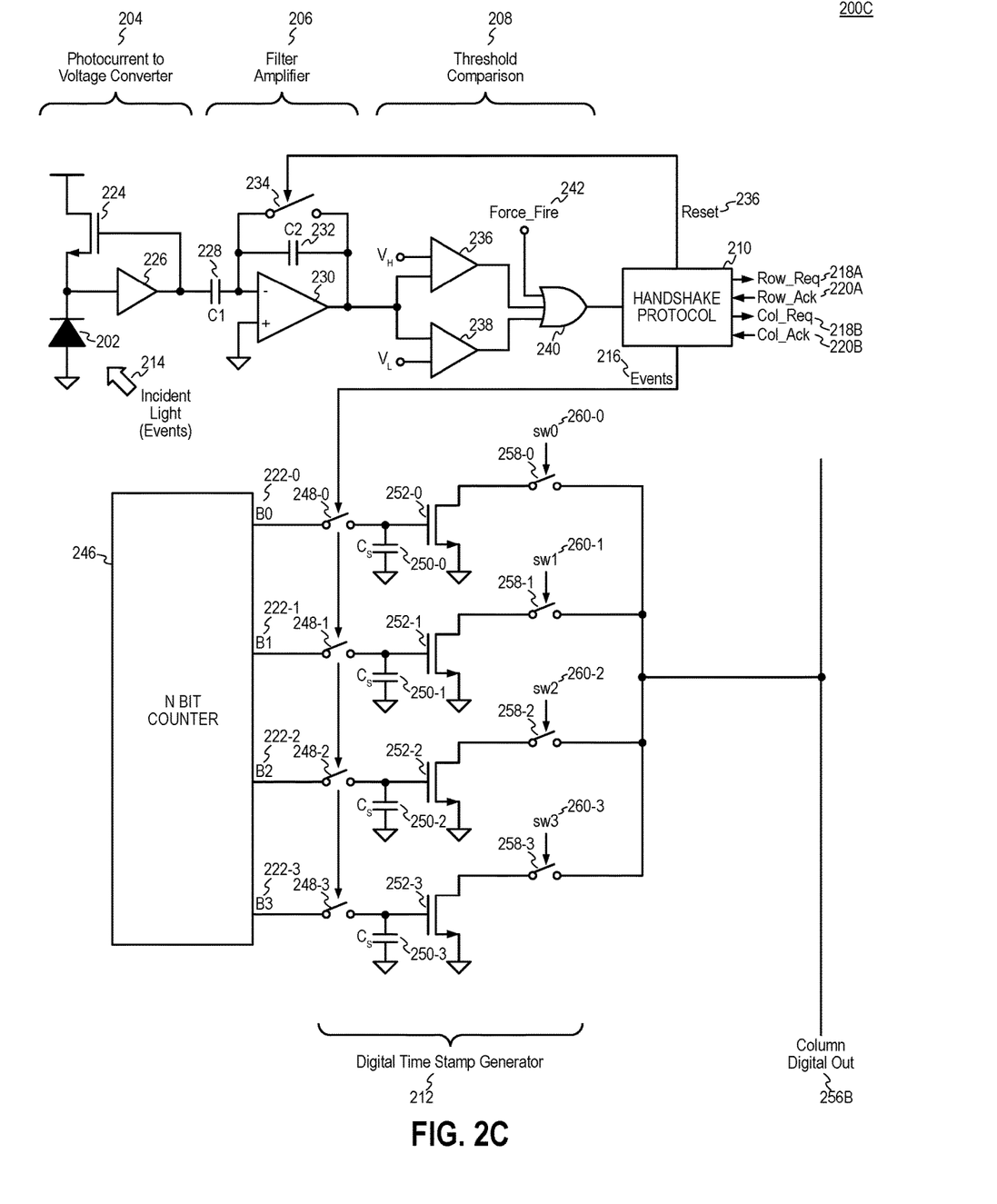
FIG. 2C illustrates a schematic of yet another example of an event driven pixel with a digital time stamping design in accordance with the teachings of the present invention.

FIG. 2C illustrates a schematic of yet another example of an event driven pixel 200C with a digital time stamping design in accordance with the teachings of the present invention. It is appreciated that the event driven pixel 200C of FIG. 2C may be another example implementation of event driven pixel 100 as shown in FIG. 1, and that similarly named and numbered elements described above are coupled and function similarly below. It is further appreciated that example event driven pixel 200B of FIG. 2C shares many similarities with example event driven sensor 200B of FIG. 2B and event driven pixel 200A of FIG. 2A.

For instance, as shown in the example depicted in FIG. 2C, event driven pixel 200C includes a photodiode 202 configured to photogenerate charge or photocurrent in response to incident light 214 received from an external scene. A photocurrent to voltage converter 204 is coupled to the photodiode 202 to convert photocurrent generated by the photodiode 202 to a voltage. In one example, photocurrent to voltage converter 204 is configured to generate an output voltage that has a logarithmic relation with the intensity of the incident light 214 received from the external scene. In the depicted example, voltage converter 204 includes an amplifier 226 having an input coupled to the photodiode 202 and a transistor 224 having a source coupled to the photodiode 202 and to the input of the amplifier 226. As shown, transistor 224 also has a gate coupled to an output of the amplifier 226, and a drain coupled to a supply voltage.

Continuing with the depicted example, a filter amplifier 206 is coupled to the photocurrent to voltage converter 204 to generate a filtered and amplified signal in response to the voltage received from the photocurrent to voltage converter 204. In the depicted example, the filter amplifier 206 includes a high pass filter that is configured to filter out lower frequency components from the voltage received from the photocurrent to voltage converter 204. In so doing, the event driven pixel 200C is configured to ignore slow or gradual changes in the photocurrent and instead detect quick or sudden changes that occur in the photocurrent generated by the photodiode 202.

In the depicted example, the filter amplifier 206 includes an opamp 230 having a first input (e.g., non-inverting input), a second input (e.g., inverting input), and an output. In the example, the first input of the opamp 230 is coupled to ground. A first capacitor C1 228 is coupled between an output of the photocurrent to voltage converter 204 and the second input of the opamp 230. A second capacitor C2 232 is coupled between the second input of the opamp 230 and the output of the opamp 230. A reset switch 234 is also coupled between the second input of the opamp 230 and the output of the opamp 230.

The example depicted in FIG. 2C shows that the threshold comparison stage 208 is coupled to the filter amplifier 206 to compare the filtered and amplified signal received from the filter amplifier 206 with thresholds (e.g., $V_H$ and $V_L$) to asynchronously detect events that occur in the external scene in response to the incident light 214. In the depicted example, threshold comparison stage 208 includes a first comparator 236 having a first input coupled to receive a high threshold value (e.g., $V_H$) and a second input coupled to receive the filtered and amplified signal from the filter amplifier 206. Threshold comparison stage 208 also includes a second comparator 238 having a first input coupled to receive a low threshold value (e.g., $V_L$) and a second input coupled to receive the filtered and amplified signal from the filter amplifier 206. In one example, the first comparator 236 may be triggered when the brightness or intensity of the incident light 214 changes in one direction (e.g., darker to brighter) and the second comparator 238 may be triggered when the brightness or intensity of the incident light 214 changes in the other direction (e.g., brighter to darker), or vice-versa.

In one example, threshold comparison stage 208 also includes an OR gate 240 having inputs that are coupled to receive the outputs of the first comparator 236 and the second comparator 238. In operation, the output of the OR gate 240 is triggered when the output of the first comparator 236 and/or the output of the second comparator 238 is triggered. Therefore, in one example, the output of OR gate 240 may be considered to be the events signal. In one example, the OR gate 240 may also be coupled to receive a Force_Fire signal 242 to force the output of OR gate 240 to be triggered.

As shown in the depicted example, a handshake protocol stage 210 is coupled to the output of the threshold comparison stage 208 to generate and receive handshake signals in response to the events asynchronously detected in incident light 214 from the external scene by the threshold comparison stage 208. In various examples, the handshake signals generated and received by the handshake protocol stage 210 include row request signal Row_Req 218A, column request signal Col_Req 218B, row acknowledge signal Row_Ack 220A, and column acknowledge signal Col_Ack 220B. In the depicted example, the handshake signals generated by handshake protocol stage 210 also include reset signal 236, which is configured to reset the reset switch 234 of filter amplifier 206 as shown in response to the events asynchronously detected in incident light 214 from the external scene by the threshold comparison stage 208. In the example depicted in FIG. 2C, the handshake protocol stage 210 is also configured to generate or forward the events signal 216 to the digital time stamp generator 212 in response to the events asynchronously detected in incident light 214 from the external scene by the threshold comparison stage 208.

As shown in the example depicted in FIG. 2C, digital time stamp generator 212 includes a plurality of N event switches including event switches 248-0, 248-1, 248-2, and 248-3 in FIG. 2C that are coupled to receive an N bit digital time stamp from a digital counter 246. In various examples, digital counter 246 is outside the pixel array and may be shared among a plurality of event driven pixels. In one example, digital counter 246 is coupled to asynchronously generate an N bit digital time stamp 222, which is configured to be stored in digital memory of the digital time stamp generator 212 in response to the events that are asynchronously detected in incident light 214 from the external scene by the threshold comparison stage 208. As shown in the example depicted in FIG. 2C, the digital time stamp 222 is an N=4 bit digital signal that includes a first bit B0 222-0, a second bit B1 222-1, a third bit B2 222-2, and a fourth bit B3 222-3. In one example, the N bit digital counter 246 is an N bit Gray code counter.

Continuing with the depicted example, event switch 248-0 is coupled to receive first bit B0 222-0, event switch 248-1 is coupled to receive second bit B1 222-1, event switch 248-2 is coupled to receive third bit B2 222-2, and event switch 248-3 is coupled to receive fourth bit B0 222-0. In the example, the event switches 248-0, 248-1, 248-2, and 248-3 are coupled to be switched in response to the events signal 216 as shown.

In the illustrated example, an N bit digital memory coupled to the plurality of N=4 event switches 248-0, 248-1, 248-2, and 248-3. In the depicted example, each bit of the digital memory is implemented with a 1T1C (one-transistor, one-capacitor) 3D MIM (three dimensional metal-insulator-metal) memory cell. As such, the example depicted in FIG. 2C illustrates the N bit digital memory including storage capacitor $C_S$ 250-0 and output transistor 252-0 coupled to event switch 248-0, storage capacitor $C_S$ 250-1 and output transistor 252-1 coupled to event switch 248-1, storage capacitor $C_S$ 250-2 and output transistor 252-2 coupled to event switch 248-2, and storage capacitor $C_S$ 250-3 and output transistor 252-3 coupled to event switch 248-3 as shown. Thus, each storage capacitor $C_S$ 250-0, 250-1, 250-2, and 250-3, is coupled to be selectively charged through a respective one of the plurality of N=4 event switches 248-0, 248-1, 248-2, and 248-3, and is coupled to ground. Each output transistor 250-0, 250-1, 250-2, and 250-3 has a gate coupled to a respective storage capacitor $C_S$ 250-0, 250-1, 250-2, and 250-3, a source coupled to ground, and a drain coupled to output the respective bit 222-0, 222-1, 222-2, and 222-3 of the N bit digital count to a column digital out 256B.

In the example depicted in FIG. 2C, the column digital out 256B includes one bitline as shown. As such, the digital time stamp generator 212 further includes a plurality of N=4 memory output switches 258-0, 258-1, 258-2, and 258-3 coupled to respective output transistors 252-0, 252-1, 252-2, and 252-3 of the N bit digital memory. In operation, each of the plurality of N=4 memory output switches 258-0, 258-1, 258-2, and 258-3 is coupled to be switched in response to a respective memory output signal sw0 260-0, sw1 260-1, sw2 260-2, and sw3 260-3 as shown.

As such, the bitline of the column digital out 256B is coupled to receive each respective bit 222-0, 222-1, 222-2, and 222-3 of the N bit digital count in sequence through a respective one of the plurality of N memory output switches 258-0, 258-1, 258-2, and 258-3 in response to respective memory output signal sw0 260-0, sw1 260-1, sw2 260-2, and sw3 260-3. It is appreciated that compared to event driven pixel 200B of FIG. 2B, event driven pixel 200C of FIG. 2C saves one transistor by not including the row acknowledge transistor 254 of event driven pixel 200B of FIG. 2B with the tradeoff of a slightly higher vertical line capacitance loading.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. An event driven pixel, comprising:
a photodiode configured to photogenerate charge in response to incident light received from an external scene;
a photocurrent to voltage converter coupled to the photodiode to convert photocurrent generated by the photodiode to a voltage;
a filter amplifier coupled to the photocurrent to voltage converter to generate a filtered and amplified signal in response to the voltage received from the photocurrent to voltage converter;
a threshold comparison stage coupled to the filter amplifier to compare the filtered and amplified signal received from the filter amplifier with thresholds to asynchronously detect events in the external scene in response to the incident light;
a handshake protocol stage coupled to the threshold comparison stage to generate and receive handshake signals in response to the events asynchronously detected in the external scene by the threshold comparison stage; and
a digital time stamp generator coupled to asynchronously generate a digital time stamp in response to the events asynchronously detected in the external scene by the threshold comparison stage, wherein the digital time stamp generator comprises:
a plurality of N event switches coupled to receive an N bit digital count; and
an N bit digital memory coupled to the plurality of N switches, wherein each bit of the digital memory is coupled to receive a respective bit of the N bit digital count through a respective one of the plurality of N event switches in response to the events asynchronously detected in the external scene, wherein the N bit digital memory is coupled to output the N bit digital count to a column digital out.

2. The event driven pixel of claim 1, wherein the handshake signals include request and acknowledge signals responsive to the events asynchronously detected in the external scene by the threshold comparison stage.

3. The event driven pixel of claim 1,
wherein the column digital out comprises a plurality of N bitlines,
wherein the digital time stamp generator further comprises a plurality of N memory output switches coupled to the N bit digital memory,
wherein each bitline of the column digital out is coupled to receive a respective bit of the N bit digital count in parallel through a respective one of the plurality of N memory output switches in response to a row acknowledge signal.

4. The event driven pixel of claim 1,
wherein the column digital out comprises a bitline,
wherein the digital time stamp generator further comprises a plurality of N memory output switches between the N bit digital memory and the bitline of the column digital out,
wherein the bitline of the column digital out is coupled to receive each respective bit of the N bit digital count in sequence through a respective one of the plurality of N memory output switches in response to a respective memory output signal.

5. The event driven pixel of claim 4,
wherein the digital time stamp generator further comprises a row acknowledge switch coupled between the plurality of N memory output switches and the bitline of the column digital out,
wherein the bitline of the column digital out is further coupled to receive each respective bit of the N bit digital count in sequence through the row acknowledge switch in response to a row acknowledge signal.

6. The event driven pixel of claim 1, wherein the N bit digital count is coupled to be received from an N bit Gray code counter.

7. The event driven pixel of claim 1, wherein each bit of the digital memory comprises:
a storage capacitor coupled between a respective one of the plurality of N event switches and ground; and
an output transistor having:
a gate coupled to the storage capacitor;
a source coupled to ground; and
a drain coupled to output the respective bit of the N bit digital count to the column digital out.

8. The event driven pixel of claim 1, wherein the voltage generated by the photocurrent to voltage converter is logarithmically proportional to the charge photogenerated by the photodiode in response to the incident light received from the external scene.

9. The event driven pixel of claim 1, wherein the photocurrent to voltage converter comprises:
an amplifier having an input coupled to the photodiode; and
a transistor having:
a source coupled to the photodiode and to the input of the amplifier;
a gate coupled to an output of the amplifier; and
a drain coupled to a supply voltage.

10. The event driven pixel of claim 1, wherein the filter amplifier comprises a high pass filter configured to filter out lower frequency components from the voltage received from the photocurrent to voltage converter.

11. The event driven pixel of claim 1, wherein the filter amplifier comprises:
an opamp having a first input, a second input, and an output, wherein the first input of the opamp is coupled to ground;
a first capacitor coupled between an output of the photocurrent to voltage converter and the second input of the opamp;
a second capacitor coupled between the second input of the opamp and the output of the opamp; and
a reset switch coupled between the second input of the opamp and the output of the opamp, wherein the reset switch is configured to be switched in response to a reset signal coupled to be received from the handshake protocol stage in response to the events asynchronously detected in the external scene by the threshold comparison stage.

12. The event driven pixel of claim 1, wherein the threshold comparison stage comprises:
a first comparator having a first input coupled to receive a high threshold value and a second input coupled to receive the filtered and amplified signal from the filter amplifier; and a second comparator having a first input coupled to receive a low threshold value and a second input coupled to receive the filtered and amplified signal from the filter amplifier.

13. The event driven pixel of claim 12, wherein the threshold comparison stage further comprises an OR gate comprising:
a first input coupled to an output of the first comparator;
a second input coupled to an output of the second comparator; and
an output coupled to an input of the handshake protocol stage.

14. A method of detecting an event, comprising:
photogenerating charge with a photodiode in response to receiving incident light from an external scene;
converting photocurrent from the photodiode to a voltage;
filtering and amplifying the voltage to generate a filtered and amplified signal;
comparing the filtered and amplified signal with thresholds to asynchronously detect events in the external scene in response to the incident light;
generating and receiving handshake signals in response to the events asynchronously detected in the external scene;
generating a digital time stamp asynchronously in response to the events asynchronously detected in the external scene, wherein said generating the digital time stamp asynchronously comprises:
generating an N bit digital count; and
storing the N bit digital count in response to the events asynchronously detected in the external scene; and
outputting the stored N bit digital count in parallel through a plurality of N memory output switches to a column digital out having plurality of N bitlines in response to a row acknowledge signal.

15. The method of claim 14, wherein the handshake signals include request and acknowledge signals responsive to the events asynchronously detected in the external scene.

16. The method of claim 14, further comprising outputting the stored N bit digital count through a plurality of N memory output switches to a column digital out having a bitline, wherein the bitline of the column digital out is coupled to receive each respective bit of the N bit digital count in sequence through a respective one of the plurality of N memory output switches in response to a respective memory output signal.

17. The method of claim 16, wherein the bitline of the column digital out is further coupled to receive each respective bit of the N bit digital count in sequence through a row acknowledge switch in response to a row acknowledge signal.

18. The method of claim 14, wherein said generating the N bit digital count comprises generating an N bit Gray code count.

19. The method of claim 14, wherein said storing the N bit digital count in response to the events asynchronously detected in the external scene comprises selectively charging a plurality of N capacitors in response to the N bit digital count.

20. The method of claim 14, wherein said converting the photocurrent from the photodiode to the voltage comprises generating the voltage to be logarithmically proportional to the charge photogenerated by the photodiode in response to the incident light received from the external scene.

21. The method of claim 14, wherein said filtering and amplifying the voltage comprises filtering out lower frequency components from the voltage to generate the filtered and amplified signal.

22. The method of claim 21, wherein said filtering and amplifying the voltage further comprises resetting said filtering and amplifying the voltage in response to asynchronously detecting the events in the external scene in response to the incident light.

23. The method of claim 14, wherein said comparing the filtered and amplified signal with thresholds to asynchronously detect events in the external scene in response to the incident light comprises:
comparing the filtered and amplified signal with a high threshold value to detect first events; and
comparing the filtered and amplified signal a low threshold value to detect second events.

24. The method of claim 23, wherein said comparing the filtered and amplified signal with thresholds to asynchronously detect the events in the external scene in response to the incident light further comprises asynchronously detecting the events in the external scene in response to the filtered and amplified signal being greater than the high threshold value or the filtered and amplified signal being less than the low threshold value.

* * * * *